United States Patent
Bu et al.

(10) Patent No.: US 10,056,912 B1
(45) Date of Patent: Aug. 21, 2018

(54) SIMULTANEOUS CANCELLATION OF MULTIPLE SPURS FROM DIFFERENT SOURCES

(71) Applicant: Avago Technologies General IP (Singapore) Pte. Ltd., Singapore (SG)

(72) Inventors: Long Bu, Foster City, CA (US); David Christopher Garrett, Tustin, CA (US); Dandan Li, San Diego, CA (US)

(73) Assignee: Avago Technologies General IP (Singapore) Pte. Ltd. (SG)

( * ) Notice: Subject to any disclaimer, the term of this patent is extended or adjusted under 35 U.S.C. 154(b) by 0 days.

(21) Appl. No.: 15/789,875

(22) Filed: Oct. 20, 2017

Related U.S. Application Data

(60) Provisional application No. 62/462,896, filed on Feb. 23, 2017.

(51) Int. Cl.
*H03L 7/06* (2006.01)
*H03L 7/107* (2006.01)
*H03L 7/091* (2006.01)

(52) U.S. Cl.
CPC ............ *H03L 7/1075* (2013.01); *H03L 7/091* (2013.01)

(58) Field of Classification Search
USPC ................... 327/147–149, 156–158
See application file for complete search history.

(56) References Cited

U.S. PATENT DOCUMENTS

| | | | | |
|---|---|---|---|---|
| 7,038,510 B2* | 5/2006 | Zhang | .................... | H03L 7/0814 |
| | | | | 327/149 |
| 7,532,696 B2* | 5/2009 | Pratt | .................... | H03C 3/0925 |
| | | | | 327/156 |
| 7,868,672 B2* | 1/2011 | Geng | .................... | H03C 3/0925 |
| | | | | 327/149 |
| 2014/0043177 A1* | 2/2014 | Pagnanelli | ............ | H03M 3/30 |
| | | | | 341/143 |
| 2014/0241335 A1* | 8/2014 | Chen | ...................... | H03L 7/093 |
| | | | | 370/342 |
| 2015/0171890 A1* | 6/2015 | Pagnanelli | ............ | H03M 3/468 |
| | | | | 341/143 |
| 2015/0326232 A1* | 11/2015 | Rahbar | ................. | H03L 7/0991 |
| | | | | 327/156 |
| 2018/0062623 A1* | 3/2018 | Pagnanelli | ............ | H03M 3/322 |

OTHER PUBLICATIONS

Ho, et al., "A Digital PLL With Feedforward Multi-Tone Spur Cancellation Scheme Achieving <-73 dBc Fractional Spur and <-110 dBc Reference Spur in 65 nm CMOS," IEEE Solid-State Circuits Society, 2016, vol. 51, No. 12, pp. 3216-3230.

* cited by examiner

*Primary Examiner* — Adam Houston
(74) *Attorney, Agent, or Firm* — McDermott Will & Emery LLP

(57) ABSTRACT

A circuit for phase locked loop (PLL) multiple spur cancellation includes multiple spur cancellation circuits and a number of multiplexers that are coupled to respective input ports of the spur cancellation circuits. The circuit further includes a number of demultiplexers that are coupled to respective output ports of the spur cancellation circuits. Each spur cancellation circuit can cancel a spur associated with a spur source, and input nodes of the multiplexers and output nodes of the demultiplexers are coupled to different connection points of a PLL circuit.

20 Claims, 4 Drawing Sheets

US 10,056,912 B1

SIMULTANEOUS CANCELLATION OF MULTIPLE SPURS FROM DIFFERENT SOURCES

CROSS-REFERENCE TO RELATED APPLICATIONS

This application claims the benefit of priority under 35 U.S.C. § 119 from United States Provisional Patent Application 62/462,896 filed Feb. 23, 2017, which is incorporated herein by reference in its entirety.

TECHNICAL FIELD

The present description relates generally to integrated circuits, and more particularly, to a circuit for digital phase locked loop (PLL) spur cancellation with simultaneous cancellation of multiple spurs from different sources.

BACKGROUND

Phase locked loop (PLL) circuits are important parts of many wireless communication systems. A PLL circuit can be implemented as an analog PLL or a digital PLL. An analog PLL may include among other components a phase detector (PD), a charge pump (CP), an analog loop filter and a voltage controlled oscillator (VCO). In a digital PLL, the PD and/or CP and the analog loop filter may be respectively replaced with a time-to-digital converter (TDC) and a digital loop filter. A digital PLL may further include a crystal oscillator and may use a sigma-delta modulator along with a frequency divider in a negative feedback path. Spurs can show up at PLL output due to the on-chip coupling to a reference path including the crystal oscillator, the feedback path, or the VCO.

The chip, for example, a system-on-chip (SoC) may include multiple clocks running at the same time to generate multiple clock signals with different clock frequencies. A clock frequency of any of the clock signals and respective harmonics of the clock signals may intermodulate with, for example, a frequency of the crystal oscillator and/or the VCO to generate spurs. The spurs can adversely affect system performance, in particular, when the intermodulated frequencies are falling within a signal band of interest. For example, the spurs may degrade a constellation error, expressed as an error vector magnitude (EVM), of one or more receivers and transmitters implemented on the same chip.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, methods and configurations are described for digital phase locked loop (PLL) spur cancellation with simultaneous cancellation of multiple spurs from different sources. The subject technology uses a calibration scheme to remove multiple spurs at the same time from both a reference path (e.g., crystal oscillator path) and a voltage-controlled oscillator (VCO) path of a digital PLL (DPLL). Existing solutions may only be able to cancel spurs due to clock signals coupling to a reference path.

The disclosed solution can be applied to cancel spurs, for example, with known frequencies. In some aspects, the spur frequencies can be calculated from clock frequencies and a channel frequency of a corresponding transceiver or measured using a spectrum analyzer. In one or more implementations, the subject solution may measure spurs at two locations and can inject cancellation tones at two locations. In some aspects, cancellation of a spur does not interfere with cancellation of other spurs. The spur cancellation of the subject technology is automatic and can be performed in real time. The disclosed spur cancellation solution is tolerant to spur phase and frequency drift (e.g., up to 100 ppm) and is robust over a wide range of fabrication process, voltage and temperature (PVT).

Figure 1:
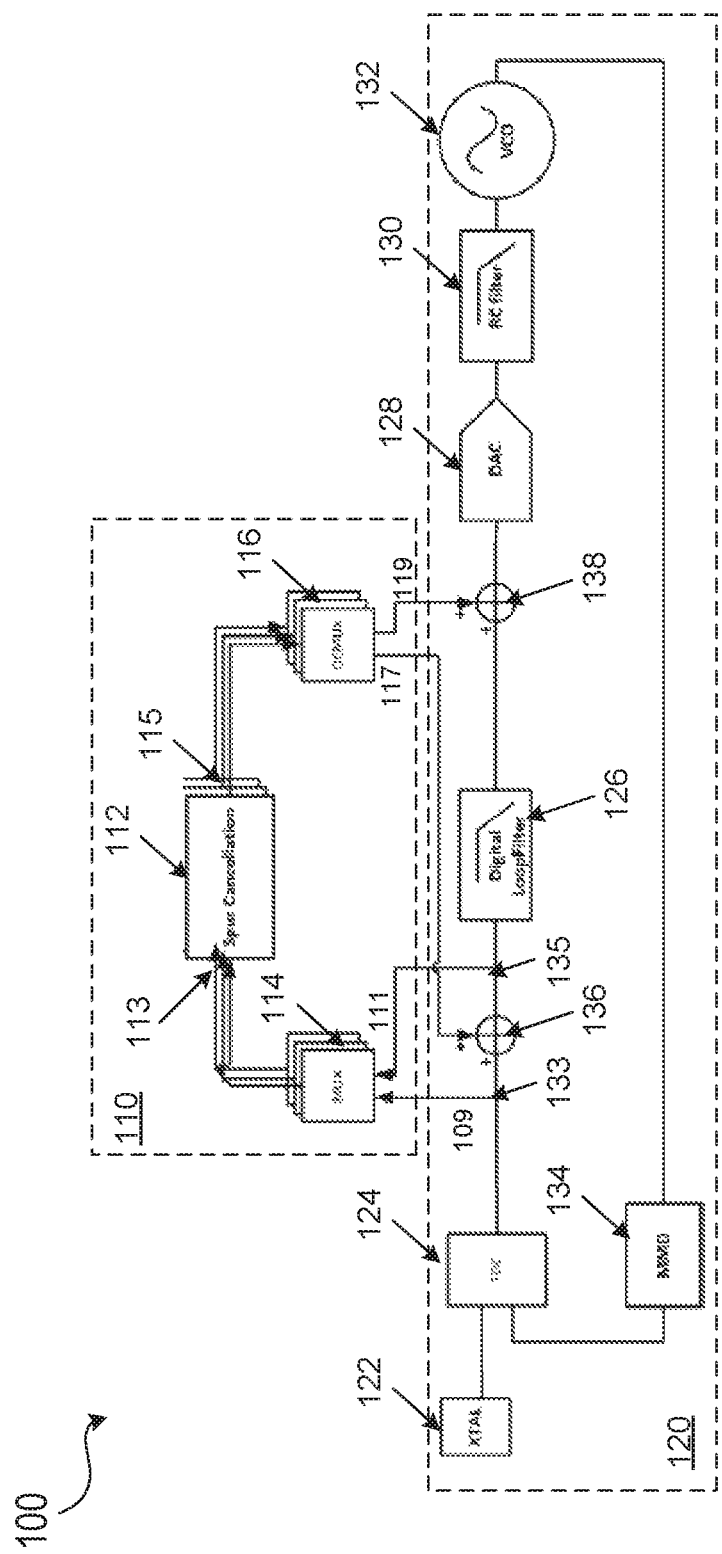
FIG. 1 is a block diagram illustrating an example digital phase locked loop (DPLL) circuit capable of simultaneous cancellation of multiple spurs, according to aspects of the subject technology.

FIG. 1 is a block diagram illustrating an example digital phase locked loop (DPLL) circuit 100 capable of simultaneous cancellation of multiple spurs, according to aspects of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The DPLL) circuit 100 can simultaneously cancel spurs from a number of sources, for example, from a reference crystal oscillator (XTAL, e.g., 122) and a voltage-controlled oscillator (VCO, e.g., 132). The spurs are unwanted signals that result from coupling (e.g., intermodulation) of clock signals of various clocks on a chip that includes the DPLL circuit 100 and the reference crystal oscillator or the VCO of the DPLL circuit 100.

The DPLL circuit 100 includes a spur cancellation block 110 coupled to a DPLL block 120. The spur cancellation block 110 can dynamically cancel spurs generated by the DPLL block 120 through automatically tracking of phases, amplitudes, and frequency drifts of the generated spurs. In some implementations, the spur cancellation block 110 includes a number of (e.g., 3) spur cancellation circuits (slices) 112 (e.g., 112-1, 112-2 . . . ), several multiplexers (MUXes) 114 (e.g., 114-1, 114-2 . . . ) and multiple demultiplexers 116 (e.g., 116-1, 116-2 . . . ). A count of the spur cancellation circuits 112 is the same as respective counts of the multiplexers 114 and demultiplexers 116. The multiplexers 114 are coupled to input ports 113 of the spur cancellation circuits 112 and the demultiplexers 116 are coupled to output ports 115 of the spur cancellation circuits 112.

Each multiplexer (e.g., one of 114) couples a selected one of two inputs 109 or 111 to a spur cancellation circuit (e.g., one of 112). In some implementations, the two inputs 109 or 111 are connected to, but not limited to, connection points 133 and 135 of the DPLL block 120. Each demultiplexer (e.g., one of 116) couples a spur cancellation circuit (e.g., one of 112) to a selected one of two outputs 117 or 119. In some implementations, the two outputs 117 or 119 are connected to, but not limited to, connection points 136 and 138 of the DPLL block 120. The connection points 136 and 138 can be implemented, for example, as summation circuits.

In one or more implementations, each spur cancellation circuit (e.g., one of 112) can be configured to cancel a particular spur, for example, a spur corresponding to the VCO path or the reference path of the DPLL block 120. In some aspects, the selection of either of the two inputs 109 or 111 or either of the two outputs 117 or 119 for each spur cancellation circuit depends on the source of the spur, which the spur cancellation circuit is configured to cancel. For example, when the spur is produced in the VCO path, the input 109 and the output 119 can be selected, and when the spur is produced in the reference path, the input 111 and the output 117 can be selected. The cancellation circuits are tolerant to phase and frequency drifts of the spurs. The drifts can be due to manufacturing process variations of clock generators, temperature changes, or voltage supply variations. In one or more implementations, each slice of spur cancellation block 110 measures spurs at one of two locations such as connection points 133 and 135 and injects cancellation tones at one of two locations, for example, at connection points 136 and 138.

The DPLL block 120 is a typical DPLL and includes known components such as the reference crystal oscillator 122, a time-to-digital converter (TDC) 124, a digital loop filter 126, a digital-to analog converter (DAC) 128, an low-pass filter (LPF) 130 (e.g., an RC filter), the VCO 132 and a multi-modulus divider (MMD) 134. The VCO generates a periodic signal (e.g., a sinusoid), a phase and a frequency of which is matched with a phase and a frequency of the reference crystal oscillator 122. The MMD 134 is an adjustable frequency divider that can divide the frequency of the VCO 132 by a real number (e.g., including an integer, a decimal, or a fraction) to match the frequency of the reference crystal oscillator 122. The TDC 124 converts a phase difference between a phase of the clock signal generated by reference crystal oscillator 122 and an output signal of the MMD 134 to a digital signal, which after passing through the digital loop filter 126 is converted by the DAC 128 to an analog signal. The analog signal from the DAC 128 is filtered by the LPF 130 and passed to the VCO 132.

In some implementations, the connection points 133 and 135 of the inputs 109 and 111 are between the TDC 124 and the digital loop filter 126, although other suitable points of the DPLL 120 may be used instead. In one or more implementations, the summation circuits at connection points 136 and 138 are implemented before and after the digital loop filter 126, although other suitable points of the DPLL 120 may be used for this purpose.

Figure 2:
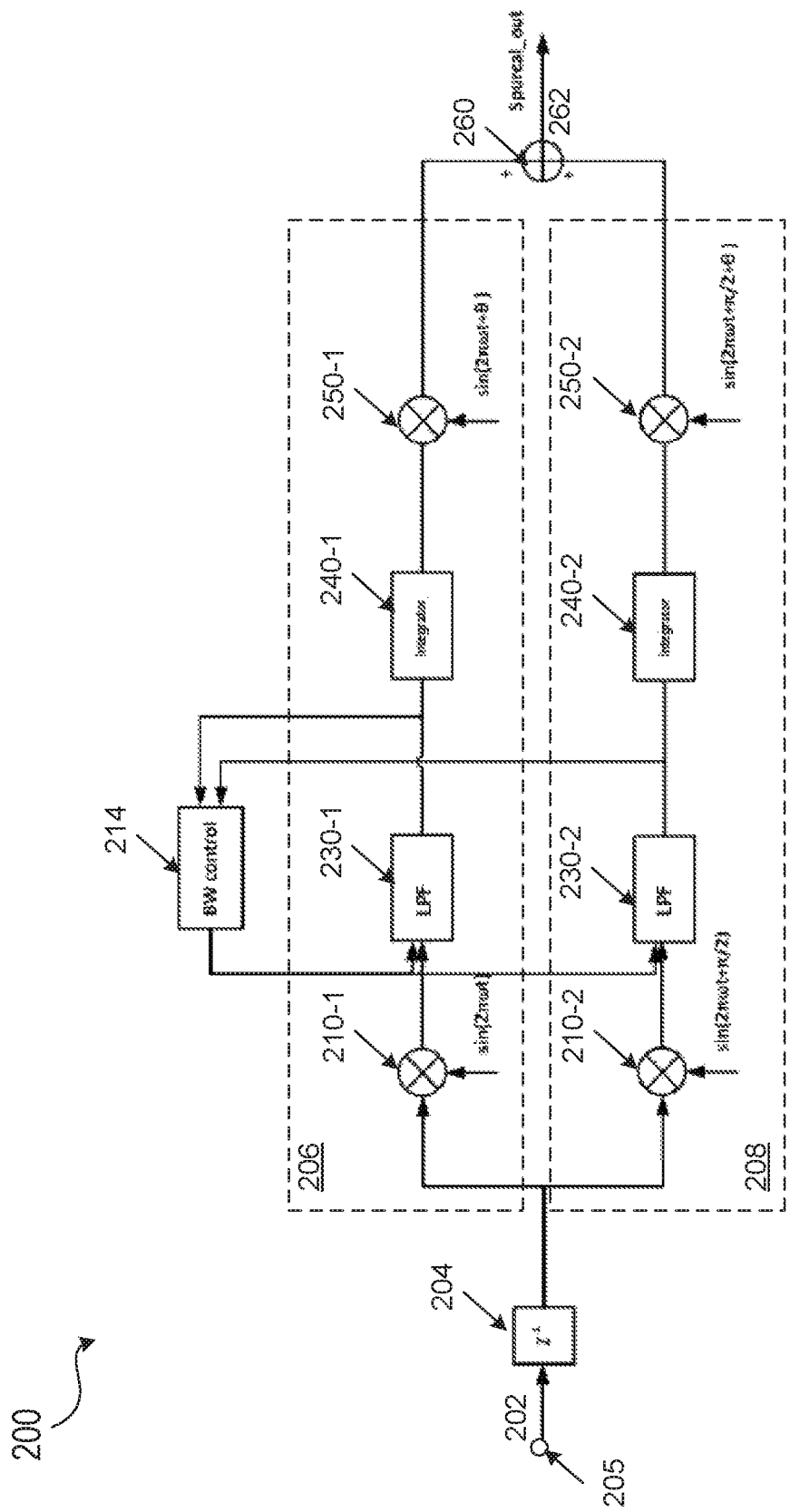
FIG. 2 is a block diagram illustrating an example circuit for simultaneous cancellation of multiple spurs of the DPLL circuit of FIG. 1, according to aspects of the subject technology.

FIG. 2 is a block diagram illustrating an example circuit 200 for simultaneous cancellation of multiple spurs of the DPLL circuit of FIG. 1, according to aspects of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The circuit 200 is an example implementation of one the spur cancellation circuits 112 of FIG. 1. The circuit 200 can receive a measured tone 202 at an input port 205 and generate a cancellation tone 262 at an output port of a summation circuit 260. The cancellation tone 262 of the circuit 200 can cancel a known spur. The known spur has a known frequency that is either measured (observed) or calculated from clock frequencies and a channel frequency of a corresponding transceiver.

In one or more implementations, the circuit 200 includes a delay 204, an in-phase (I) path 206 and a quadrature (Q) path 208. The delay 204 may be implemented by a Z-transform term $(Z^{-1})$, as shown in FIG. 2. The in-phase path includes a down-converter 210-1, an LPF 230-1, an integrator 240-1 and an up-converter 250-1. The quadrature path includes a down-converter 210-2, an LPF 230-2, an integrator 240-2 and an up-converter 250-2. The LPF 230-1 and the integrator 240-1 are similar to the LPF 230-2 and the integrator 240-2. The down-converter 210-1 is similar to the down-converter 210-2 in structure and functionalities, however, they use different local oscillator (LO) signals with similar frequencies but with different phases (e.g., with π/2 radians phase difference). Similarly, the up-converter 250-1 is similar to the up-converter 250-2 in structure and functionalities, but, they use different local oscillator (LO) signals with similar frequencies but with different phases (e.g., with π/2 radians phase difference).

The down-conversion and up-conversion frequency (w) of the down-converters 210 (e.g., 210-1 and 210-2) and the up-converters 250 (e.g., 250-1 and 250-2) is the know frequency of the spur that is being canceled. In other words, the down-converters 210 down-converts the known spur to a baseband signal, then the baseband signal is processed by the LPFs 230 (e.g., 230-1 and 230-2) and the integrators 240 (e.g., 240-1 and 240-2) before being up-converted to the spur original frequency. The processing of the baseband signal before up-conversion can adjust the phase and amplitude of the baseband signal such that, after the up-conversion, the generated tone can be able to cancel the intended spur. The phase is adjusted at the up-conversion stage in order to compensate the phase shift in the closed loop response of the DPLL 120 of FIG. 1. The gain and bandwidth (BW) are dynamically controlled, for example, by the BW controller 214. The BW controller 214 can speed up the processing of the baseband signal.

Figure 3:
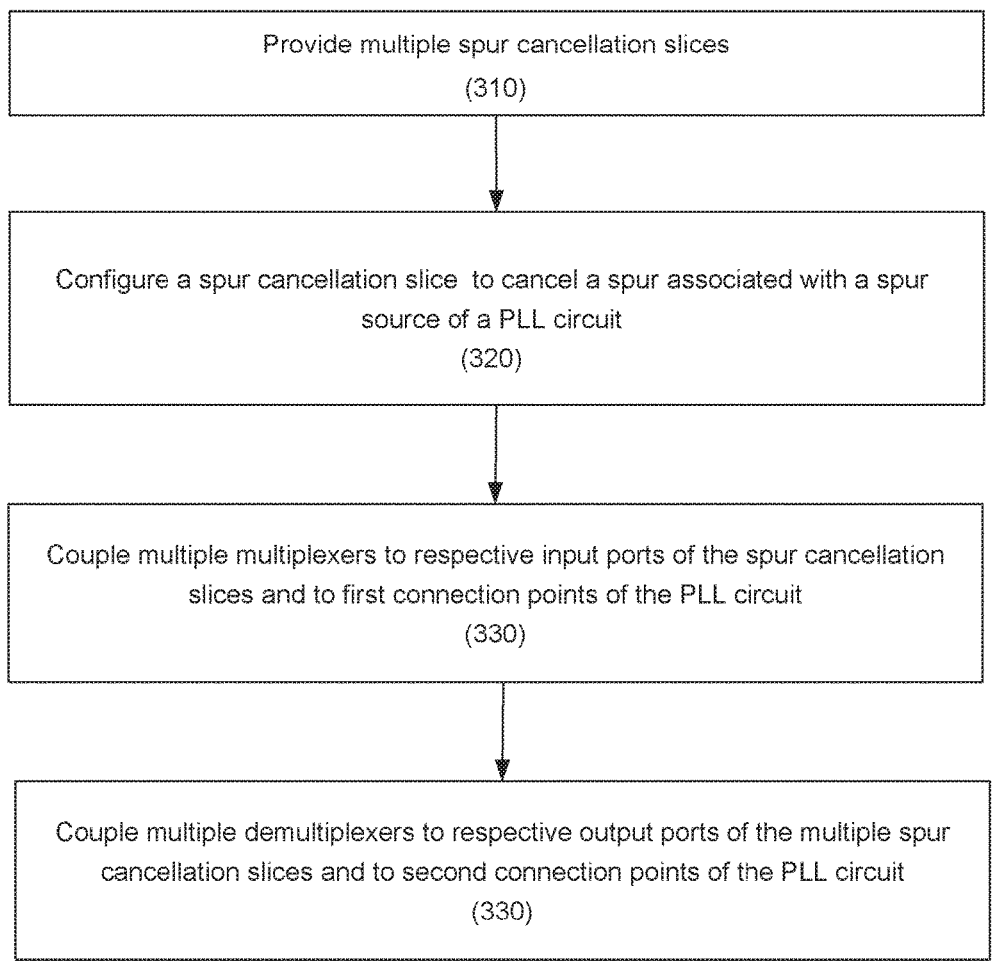
FIG. 3 is flow diagram illustrating an example method of providing a DPLL circuit capable of simultaneous cancellation of multiple spurs, according to aspects of the subject technology.

FIG. 3 is flow diagram illustrating an example method 300 of providing a DPLL circuit capable of simultaneous cancellation of multiple spurs, according to aspects of the subject technology. For explanatory purposes, the method 300 is primarily described herein with reference to the DPLL circuit 100 of FIG. 1. However, the method 300 is not limited to the DPLL circuit 100, and one or more blocks (or operations) of the method 300 may be performed by one or more other components of the DPLL circuit 100. Further for explanatory purposes, the blocks of the example method 300 are described herein as occurring in serial, or linearly. However, multiple blocks of the example method 300 may occur in parallel. In addition, the blocks of the example method 300 need not be performed in the order shown and/or one or more of the blocks of the example method 300 need not be performed.

The method 300 includes providing multiple spur cancellation slices (e.g., 112 of FIG. 1) (310). The method 300 further includes configuring a spur cancellation slice to cancel a spur associated with a spur source of a PLL circuit (e.g., 120 of FIG. 1) (320). Multiple multiplexers (e.g., 114 of FIG. 1) may be coupled to respective input ports (e.g., 113 of FIG. 1) of the spur cancellation slices and to first connection points (e.g., 133 and 135 of FIG. 1) of the PLL circuit (330). Multiple demultiplexers (e.g., 116 of FIG. 1) may be coupled to respective output ports (e.g., 115 of FIG. 1) of the spur cancellation slices and to second connection points (e.g., 136 and 138 of FIG. 1) of the PLL circuit (340).

Figure 4:
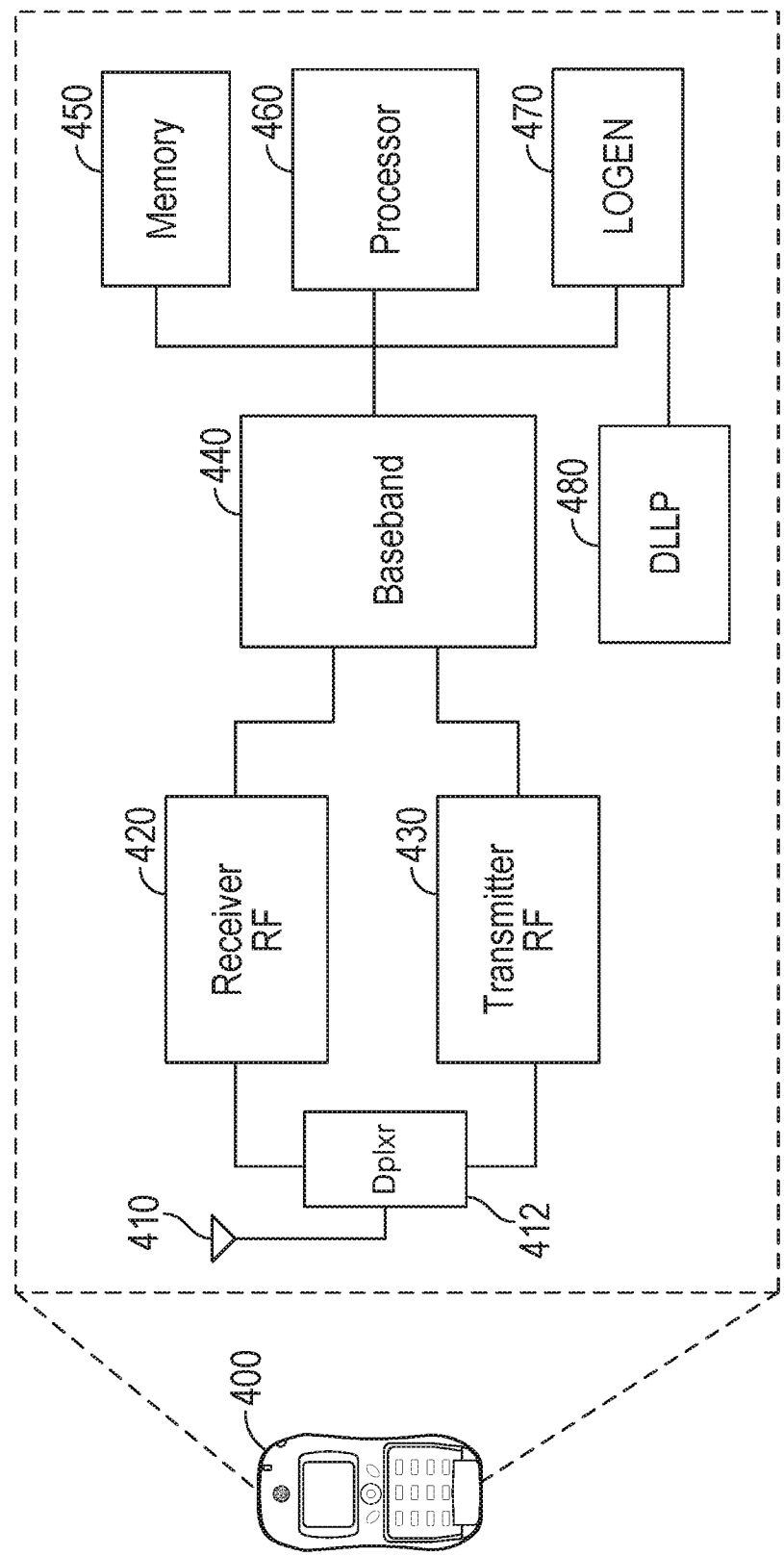
FIG. 4 is a block diagram illustrating an example wireless communication device in accordance with one or more implementations of the subject technology.

FIG. 4 is a block diagram illustrating an example wireless communication device 400 in accordance with one or more implementations of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The wireless communication device 400 may comprise a radio-frequency (RF) antenna 410, a receiver 420, a transmitter 430, a baseband processing module 440, a memory 450, a processor 460, a local oscillator generator (LOGEN) 470, and a DPLL 480. In various embodiments of the subject technology, one or more of the blocks represented in FIG. 4 may be integrated on one or more semiconductor substrates. For example, the blocks 420-480 may be realized in a single chip or a single system on chip, or may be realized in a multi-chip chipset.

The RF antenna 410 may be suitable for transmitting and/or receiving RF signals (e.g., wireless signals) over a wide range of frequencies (e.g., 60 GHz band). Although a single RF antenna 410 is illustrated, the subject technology is not so limited.

The receiver 420 may comprise suitable logic circuitry and/or code that may be operable to receive and process signals from the RF antenna 410. The receiver 420 may, for example, be operable to amplify and/or down-convert received wireless signals. In various embodiments of the subject technology, the receiver 420 may be operable to cancel noise in received signals and may be in close proximity to over a wide range of frequencies. In this manner, the receiver 420 may be suitable for receiving signals in accordance with a variety of wireless standards. Wi-Fi, WiMAX, Bluetooth, and various cellular standards. In various embodiments of the subject technology, the receiver 420 may not require any SAW filters and few or no off-chip discrete components such as large capacitors and inductors. In some implementations, the receiver 420 may include one or more DPLLs (e.g., DPLL 100 of FIG. 1) that are capable of simultaneous cancellation of multiple spurs from different sources as described above.

The transmitter 430 may comprise suitable logic circuitry and/or code that may be operable to process and transmit signals from the RF antenna 410. The transmitter 430 may, for example, be operable to up-convert baseband signals to RF signals and amplify RF signals. In various embodiments of the subject technology, the transmitter 430 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 430 may be operable to provide signals for further amplification by one or more power amplifiers.

The duplexer 412 may provide isolation in the transmit band to avoid saturation of the receiver 420 or damaging parts of the receiver 420, and to relax one or more design requirements of the receiver 420. Furthermore, the duplexer 412 may attenuate the noise in the receive band. The duplexer may be operable in multiple frequency bands of various wireless standards.

The baseband processing module 440 may comprise suitable logic, circuitry, interfaces, and/or code that may be operable to perform processing of baseband signals. The baseband processing module 440 may, for example, analyze received signals and generate control and/or feedback signals for configuring various components of the wireless communication device 400 such as the receiver 420. The baseband processing module 440 may be operable to encode, decode, transcode, modulate, demodulate, encrypt, decrypt, scramble, descramble, and/or otherwise process data in accordance with one or more wireless standards.

The processor 460 may comprise suitable logic, circuitry, and/or code that may enable processing data and/or controlling operations of the wireless communication device 400. In this regard, the processor 460 may be enabled to provide control signals to various other portions of the wireless communication device 400. The processor 460 may also control transfers of data between various portions of the wireless communication device 400. Additionally, the processor 460 may enable implementation of an operating system or otherwise execute code to manage operations of the wireless communication device 400.

The memory 450 may comprise suitable logic, circuitry, and/or code that may enable storage of various types of information such as received data, generated data, code, and/or configuration information. The memory 450 may comprise, for example, RAM, ROM, flash, and/or magnetic storage. In various embodiment of the subject technology, Information stored in the memory 450 may be utilized for configuring the receiver 420 and/or the baseband processing module 440.

The local oscillator generator (LOGEN) 470 may comprise suitable logic, circuitry, interfaces, and/or code that may be operable to generate one or more oscillating signals of one or more frequencies. The LOGEN 470 may be operable to generate digital and/or analog signals. In this manner, the LOGEN 470 may be operable to generate one or more clock signals and/or sinusoidal signals. Characteristics of the oscillating signals such as the frequency and duty cycle may be determined based on one or more control signals from, for example, the processor 460 and/or the baseband processing module 440. In some implementations, the DPPL 480 can provide a reference clock frequency for the LOGEN 470. The DPPL 480 may be implemented, for example, using the subject technology (e.g., 100 of FIG. 1).

In operation, the processor 460 may configure the various components of the wireless communication device 400 based on a wireless standard according to which it is desired to receive signals. Wireless signals may be received via the RF antenna 410 and amplified and down-converted by the receiver 420. The baseband processing module 440 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 450, and/or information affecting and/or enabling operation of the wireless communication device 400. The baseband processing module 440 may modulate, encode and perform other processing on audio, video, and/or control signals to be transmitted by the transmitter 430 in accordance to various wireless standards.

In some embodiments, a PA of the RF transmitter 430 can be coupled to a PA driver via the notch filter of the subject technology to benefit from the linearity, high Q, wide range of tunability, low noise and other advantageous features of the disclosed technology.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A circuit for phase locked loop (PLL) multiple spur cancellation, the circuit comprising:
    a plurality of spur cancellation circuits;
    a plurality of multiplexers coupled to respective input ports of the plurality of spur cancellation circuits; and
    a plurality of demultiplexers coupled to respective output ports of the plurality of spur cancellation circuits,
    wherein:
    a spur cancellation circuit of the plurality of spur cancellation circuits is configured to cancel a spur associated with a spur source, and
    input nodes of the plurality of multiplexers and output nodes of the plurality of demultiplexers are coupled to different connection points of a PLL circuit.

2. The circuit of claim 1, wherein at least two of the plurality of spur cancellation circuits are configured to independently cancel spurs associated with a reference clock source and a voltage controlled oscillator (VCO) of the PLL circuit.

3. The circuit of claim 1, wherein the input nodes of the plurality of multiplexers are coupled to an output node of a time-to-digital converter (TDC) of the PLL circuit.

4. The circuit of claim 1, wherein at least one of the output nodes of the plurality of demultiplexers are coupled to an output node of a digital loop filter of the PLL circuit.

5. The circuit of claim 1, wherein the plurality of spur cancellation circuits are configured to dynamically cancel spurs by automatically tracking phases, amplitudes, and frequency drifts associated with the spurs.

6. The circuit of claim 5, wherein the plurality of spur cancellation circuits are tolerant to phase and frequency drifts of the spurs.

7. The circuit of claim 1, wherein the spur cancellation circuit of the plurality of spur cancellation circuits comprises in-phase (I) and quadrature (Q) paths including down-conversion stages and up-conversion stages, and a bandwidth control block.

8. The circuit of claim 7, wherein the up-conversion stages are configured to make a phase adjustment to down-converted spurs to compensate a phase shift due to a closed loop response of the PLL circuit.

9. The circuit of claim 7, wherein the bandwidth control block is configured to speed up the up-conversion stages.

10. The circuit of claim 7, wherein the spur cancellation circuit of the plurality of spur cancellation circuits is configured to dynamically control a gain and a bandwidth of the I and Q paths.

11. A method for providing a circuit for phase locked loop (PLL) multiple spur cancellation, the method comprising:
    providing multiple spur cancellation slices;
    configuring a spur cancellation slice of the multiple spur cancellation slices to cancel a spur associated with a spur source of a PLL circuit;
    coupling multiple multiplexers to respective input ports of the multiple spur cancellation slices and to first connection points of the PLL circuit; and coupling multiple demultiplexers to respective output ports of the multiple spur cancellation slices and to second connection points of the PLL circuit.

12. The method of claim 11, further comprising configuring at least two of the multiple spur cancellation slices to independently cancel spurs associated with a reference clock source and a voltage controlled oscillator (VCO) of the PLL circuit.

13. The method of claim 11, further comprising coupling the respective input nodes of the multiple multiplexers to an output node of a time-to-digital converter (TDC) of the PLL circuit, and coupling at least one of the output nodes of the multiple demultiplexers to an output node of a digital loop filter of the PLL circuit.

14. The method of claim 11, further comprising configuring the multiple spur cancellation slices to dynamically cancel spurs by automatically tracking phases, amplitudes, and frequency drifts associated with the spurs.

15. The method of claim 14, wherein the multiple spur cancellation slices are tolerant to phase and frequency drifts of the spurs.

16. The method of claim 11, wherein providing the spur cancellation slice of the multiple spur cancellation slices comprises providing in-phase (I) and quadrature (Q) paths including down-conversion stages and up-conversion stages, and a bandwidth control block.

17. The method of claim 16, further comprising configuring the up-conversion stages to make a phase adjustment to down-converted spurs to compensate a phase shift due to a closed loop response of the PLL circuit.

18. The method of claim 16, further comprising configuring the spur cancellation slice of the multiple spur cancellation slices to dynamically control a gain and a bandwidth of the I and Q paths.

19. A wireless communication device, the device comprising:
one or more phase locked loop (PLL) circuits, at least one of the one or more PLL circuits being configured to cancel multiple spurs from multiple sources, and
the at least one of the one or more PLL circuits comprising:
a plurality of spur cancellation slices configured to cancel the multiple spurs from the multiple sources;
a plurality of multiplexers coupled to respective input ports of the plurality of spur cancellation slices and to first connection points of the at least one of the one or more PLL circuits; and
a plurality of demultiplexers coupled to respective output ports of the plurality of spur cancellation slices and to second connection points of the at least one of the one or more PLL circuits.

20. The device of claim 19, wherein the plurality of spur cancellation slices are configured to dynamically cancel the multiple spurs by automatically tracking phases, amplitudes, and frequency drifts associated with the multiple spurs, and wherein the plurality of spur cancellation slices are tolerant to phase and frequency drifts of the multiple spurs.

* * * * *